(12) United States Patent
Zhou et al.

(10) Patent No.: US 12,347,384 B2
(45) Date of Patent: Jul. 1, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hongjun Zhou, Beijing (CN); Wen Tan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 105 days.

(21) Appl. No.: 17/773,077

(22) PCT Filed: May 13, 2021

(86) PCT No.: PCT/CN2021/093627
§ 371 (c)(1),
(2) Date: Apr. 29, 2022

(87) PCT Pub. No.: WO2022/001410
PCT Pub. Date: Jan. 6, 2022

(65) Prior Publication Data
US 2024/0147786 A1     May 2, 2024

(30) Foreign Application Priority Data

Jun. 30, 2020   (CN) .................. 202010621917.9

(51) Int. Cl.
*H10K 59/131*  (2023.01)
*G09G 3/3241*  (2016.01)
*H10K 59/121*  (2023.01)

(52) U.S. Cl.
CPC ....... *G09G 3/3241* (2013.01); *H10K 59/1213* (2023.02); *H10K 59/1216* (2023.02); *H10K 59/131* (2023.02)

(58) Field of Classification Search
CPC ............ H10K 59/131; H10K 59/1213; H10K 59/1216; G02F 1/13452; G02F 1/136213;
(Continued)

(56) References Cited

U.S. PATENT DOCUMENTS

| 11,677,058 B2 * | 6/2023 | Park .................. H01L 33/62 257/79 |
| 2011/0057861 A1 * | 3/2011 | Cok .................. H10K 59/18 345/1.3 |

(Continued)

FOREIGN PATENT DOCUMENTS

| CN | 104409037 A | 3/2015 |
| CN | 104536176 A | 4/2015 |

(Continued)

OTHER PUBLICATIONS

Office Action cited in related CN 202010621917.9 dated Oct. 18, 2024.

*Primary Examiner* — Matthew A Eason
*Assistant Examiner* — Scott D Au
(74) *Attorney, Agent, or Firm* — LEASON ELLIS LLP

(57) ABSTRACT

A display substrate and a display device are provided. The display substrate has a display region and a peripheral region, and includes a base substrate. The display region includes a plurality of pixel units and a plurality of signal lines; the peripheral region includes at least one first electrode pattern and a second electrode pattern, the at least one first electrode pattern and the second electrode pattern are at least partially overlapped and are spaced apart from and insulated from each other, the peripheral region further includes a gate scan driving circuit configured to provide a (Continued)

gate scanning signal to the plurality of pixel units, the at least one first electrode pattern and the second electrode pattern are between the gate scan driving circuit and the display region in a direction parallel to the substrate surface of the base substrate.

18 Claims, 9 Drawing Sheets

(58) Field of Classification Search
CPC ............ G02F 1/136286; G09G 3/3611; G09G 3/3648; G09G 3/3677; G09G 3/3688; G09G 2300/0426; G09G 2300/0876; G09G 2320/0204; G09G 2320/0247; H01L 27/124; H01L 27/1255
See application file for complete search history.

(56) References Cited

U.S. PATENT DOCUMENTS

| | | | |
|---|---|---|---|
| 2016/0093247 A1 | 3/2016 | Lim et al. | |
| 2017/0141172 A1 | 5/2017 | Cho et al. | |
| 2019/0219852 A1 | 7/2019 | Chang | |
| 2019/0287476 A1* | 9/2019 | Chung | H01L 27/1255 |
| 2019/0361551 A1* | 11/2019 | Lius | G06F 3/0412 |

FOREIGN PATENT DOCUMENTS

| | | |
|---|---|---|
| CN | 104965361 A2 | 10/2015 |
| CN | 106991990 A | 7/2017 |
| CN | 107424551 A | 12/2017 |
| CN | 107705756 A | 2/2018 |
| CN | 108598127 A | 9/2018 |
| CN | 109300953 A | 2/2019 |
| CN | 109473454 A | 3/2019 |
| CN | 209560243 U | 10/2019 |
| KR | 20090005651 A | 1/2009 |

* cited by examiner

DISPLAY SUBSTRATE AND DISPLAY DEVICE

CROSS-REFERENCE TO RELATED PATENT APPLICATIONS

TThis application is a U.S. National Stage Application under 35 U.S.C. § 371 of International Patent Application No. PCT/CN2021/093627 filed May 13, 2021, which claims the benefit of priority of Chinese Patent Application number 202010621917.9 filed Jun. 30, 2020, both of which are incorporated by reference in their entireties. The International Application was published on Jan. 6, 2020, as International Publication No. WO 2022/001410 A1.

TECHNICAL FIELD

At least one embodiment of the present disclosure relates to a display substrate and a display device.

BACKGROUND

Organic Light-Emitting Diode (OLED) display devices have many advantages, such as thin thickness, light weight, wide viewing angle, active lighting, continuously adjustable lighting color, low cost, fast response speed, low energy consumption, low driving voltage, wide working temperature range, simple production process, high lighting efficiency and flexible display, and therefore it is widely used in mobile phones, tablet computers, digital cameras and other display fields.

SUMMARY

At least one embodiment of the present disclosure provides a display substrate, having a display region and a peripheral region at least partially surrounding the display region, and comprising: a base substrate, the display region comprises a plurality of pixel units arranged in an array on the base substrate and a plurality of signal lines electrically connected with the plurality of pixel units respectively, the peripheral region comprises at least one first electrode pattern electrically connected with at least one of the plurality of signal lines, and comprises a second electrode pattern, the at least one first electrode pattern and the second electrode pattern are at least partially overlapped in a direction perpendicular to a substrate surface of the base substrate and are spaced apart from and insulated from each other, the peripheral region further comprises a gate scan driving circuit configured to provide a gate scanning signal to the plurality of pixel units, the at least one first electrode pattern and the second electrode pattern are between the gate scan driving circuit and the display region in a direction parallel to the substrate surface of the base substrate.

For example, in the display substrate provided by at least an embodiment of the present disclosure, an orthographic projection of the at least one first electrode pattern on the base substrate is within an orthographic projection of the second electrode pattern on the base substrate.

For example, in the display substrate provided by at least an embodiment of the present disclosure, the second electrode pattern is on a side of the at least one first electrode pattern away from the base substrate.

For example, in the display substrate provided by at least an embodiment of the present disclosure, at least one of the plurality of pixel units comprises a pixel driving circuit on the base substrate, and the pixel driving circuit comprises a thin film transistor and a storage capacitor; the thin film transistor comprises an active layer, a gate electrode, a source electrode and a drain electrode, and the storage capacitor comprises a first capacitor electrode and a second capacitor electrode opposite to the first capacitor electrode in the direction perpendicular to the substrate surface of the base substrate; the source electrode and the drain electrode are on a side of the active layer away from the base substrate, the first electrode pattern, the gate electrode and the first capacitor electrode are in a same layer, and the second electrode pattern and the second capacitor electrode are in a same layer.

For example, in the display substrate provided by at least an embodiment of the present disclosure, the plurality of signal lines are in a same layer as the source electrode and the drain electrode of the thin film transistor, and the at least one first electrode pattern is electrically connected with the at least one of the plurality of signal lines through a via hole structure.

For example, in the display substrate provided by at least an embodiment of the present disclosure, the second electrode pattern is configured to receive a first voltage signal from a first voltage source.

For example, in the display substrate provided by at least an embodiment of the present disclosure, the peripheral region further comprises a power wire pattern, the power wire pattern is electrically connected with the first voltage source, and the second electrode pattern is electrically connected with the power wire pattern to receive the first voltage signal through the power wire pattern.

For example, in the display substrate provided by at least an embodiment of the present disclosure, the power wire pattern is in a same layer as the source electrode and the drain electrode of the thin film transistor, the second electrode pattern is electrically connected with the power wire pattern through a via hole structure.

For example, in the display substrate provided by at least an embodiment of the present disclosure, at least part of the second electrode pattern is electrically connected between the power wire pattern and the plurality of pixel units in the direction parallel to the substrate surface of the base substrate, the power wire pattern provides the first voltage signal to at least part of the plurality of pixel units through the second electrode pattern.

For example, in the display substrate provided by at least an embodiment of the present disclosure, the at least one first electrode pattern comprises a plurality of first electrode patterns which are arranged at intervals; the peripheral region further comprises a spacer pattern which is between two adjacent first electrode patterns of the plurality of first electrode patterns and is insulated from the first electrode patterns.

For example, in the display substrate provided by at least an embodiment of the present disclosure, the spacer pattern is configured to receive a second voltage signal from a second voltage source different from the first voltage source.

For example, in the display substrate provided by at least an embodiment of the present disclosure, the spacer pattern is electrically connected with the second electrode pattern to receive the first voltage signal from the first voltage source.

For example, in the display substrate provided by at least an embodiment of the present disclosure, the spacer pattern is in a same layer as the active layer of the thin film transistor.

For example, in the display substrate provided by at least an embodiment of the present disclosure, the second electrode pattern is continuously arranged along an edge of the display region, the second electrode pattern is at least partially overlapped with the plurality of first electrode patterns respectively in the direction perpendicular to the substrate surface of the base substrate, and the second electrode pattern is spaced apart from and insulated from the plurality of first electrode patterns.

For example, in the display substrate provided by at least an embodiment of the present disclosure, an extension direction of at least part of an edge of the display region intersects and is not perpendicular to an extension direction of the plurality of signal lines.

For example, in the display substrate provided by at least an embodiment of the present disclosure, the display substrate further comprises a first insulation layer between the at least one first electrode pattern and the second electrode pattern, a material of the first insulation layer comprises silicon nitride or silicon oxynitride.

For example, in the display substrate provided by at least an embodiment of the present disclosure, the plurality of pixel units comprise a first column of pixel units and a second column of pixel units, a total number of the pixel units in the first column of pixel units is less than that in the second column of pixel units, and the signal line electrically connected with the first column of pixel units is electrically connected with one of the at least one first electrode pattern.

For example, in the display substrate provided by at least an embodiment of the present disclosure, the signal line electrically connected to the second column of pixel units is electrically connected to another one of the at least one first electrode pattern, an amount of a compensation capacitance formed between the second electrode pattern and the one of the at least one first electrode pattern is larger than an amount of a compensation capacitance formed between the second electrode pattern and the another one first electrode pattern, wherein the one of the at least one first electrode pattern is electrically connected to the signal line electrically connected to the first column of pixel units.

For example, in the display substrate provided by at least an embodiment of the present disclosure, the at least one first electrode pattern and the second electrode pattern have different lengths in a column direction, or the at least one first electrode pattern and the second electrode pattern have different lengths in a row direction.

For example, in the display substrate provided by at least an embodiment of the present disclosure, the plurality of signal lines are scanning lines or data lines.

For example, in the display substrate provided by at least an embodiment of the present disclosure, a first end or a second end of at least one of the plurality of signal lines is electrically connected with one of the at least one first electrode pattern, or a first end of at least one of the plurality of signal lines is electrically connected with one of the at least one first electrode pattern, and a second end of the at least one of the plurality of signal lines is electrically connected with another one of the at least one first electrode pattern.

At least one embodiment of the present disclosure further provides a display device, comprising the display substrate according to the afore-mentioned display substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
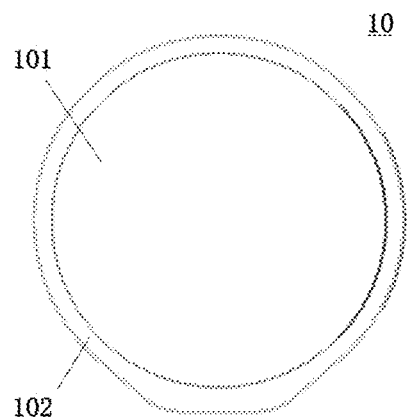
FIG. 1A is a schematic planar view of a display substrate provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "left," "right" and the like are only used to indicate relative position relationship, and when the position of the object which is described is changed, the relative position relationship may be changed accordingly.

At present, with the popularization of electronic display products, users' requirements for functions and appearance of electronic display products are further increased. In order to meet the different practical needs of users, the appearance or display region of electronic display products sometimes needs to be designed into irregular or special shapes. However, due to the irregular or special shape of the display region, the number of pixel units included in different rows in the display region may be different, or the number of pixel units included in different columns in the display region may also be different. For example, taking the case that the number of pixel units included in different columns in the display region are different as an example, due to the different numbers of pixel units in different columns, transmission loads on a plurality of signal lines for providing data signals or other required electrical signals to the pixel units located in different columns may be different, resulting in inconsistent signal transmission effects (e.g., transmission speed) of the plurality of signal lines, and further resulting in reduced brightness uniformity and consistency of display images provided by the electronic display products, and even abnormal phenomenon of display screen.

At least one embodiment of the present disclosure provides a display substrate, the display substrate has a display region and a peripheral region at least partially surrounding the display region, and comprises a base substrate. The display region comprises a plurality of pixel units arranged in an array on the base substrate and a plurality of signal lines respectively electrically connected with the plurality of pixel units; the peripheral region comprises at least one first electrode pattern electrically connected with at least one of the plurality of signal lines, and comprises a second electrode pattern, the at least one first electrode pattern and the second electrode pattern are at least partially overlapped in a direction perpendicular to a substrate surface of the base substrate and are spaced apart from and insulated from each other, the peripheral region further comprises a gate scan driving circuit configured to provide a gate scanning signal to the plurality of pixel units, the at least one first electrode pattern and the second electrode pattern are between the gate scan driving circuit and the display region in a direction parallel to the substrate surface of the base substrate.

In the display substrate provided by the above embodiment, the first electrode pattern and the second electrode pattern are at least partially overlapped in the direction perpendicular to the substrate surface of the base substrate and insulated from each other, so that a capacitor can be formed between the first electrode pattern and the second electrode pattern, thereby compensating the transmission load on the signal lines electrically connected with the first electrode pattern, increasing the consistency of signal transmission effects of the plurality of signal lines, and further increasing the brightness uniformity and consistency of the display image, weakening or avoiding the abnormal or bad phenomenon of the display screen and improving the display effect of display images.

Hereinafter, some embodiments of the present disclosure are described in detail with reference to the accompanying drawings. It should be noted that the same reference numerals in different drawings are used to refer to the same elements already described.

FIG. 1A is a schematic planar view of a display substrate provided by some embodiments of the present disclosure. As shown in FIG. 1A, the display substrate 10 has a display region 101 and a peripheral region 102 at least partially surrounding (for example, the peripheral region 102 completely surrounds the display region 101) the display region 101. For example, the display region 101 of the display substrate 10 is in a circular shape, and the peripheral region 102 surrounds the display region 101 and has a contour which is in an approximately circular shape, thereby allowing the display substrate 10 to be in an approximately circular shape to meet the actual needs of users for display substrates with different shapes.

Figure 1B:
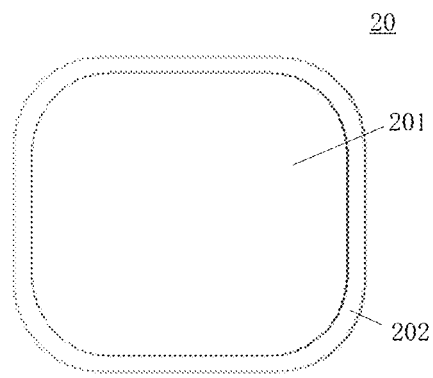
FIG. 1B is a schematic planar view of another display substrate provided by some embodiments of the present disclosure.

It should be noted that embodiments of the present disclosure impose no limitation to the specific shape of the display substrate. For example, FIG. 1B is a schematic planar view of another display substrate provided by some embodiments of the present disclosure. As shown in FIG. 1B, the display substrate 20 has a display region 201 and a peripheral region 202 at least partially surrounding (for example, the peripheral region 202 completely surrounds the display region 201) the display region 201. For example, the display region 201 of the display substrate 20 is in a square shape with rounded corners, and the peripheral region 202 surrounds the display region 201 and has the same contour as the display region 201, so that the display substrate 20 is also in a square shape with rounded corners. In other embodiments of the present disclosure, the display substrate is in regular shapes such as ellipsoid, sector, triangle, rhombus, pentagon, or other suitable irregular shapes, and the embodiments of the present disclosure impose no limitation to the shape of the display substrate.

In the following, the embodiment of the present disclosure takes the shape of the display substrate 10 shown in FIG. 1A as an example to explain the display substrate provided by the embodiment of the present disclosure, but this does not constitute a limitation on the embodiments of the present disclosure.

Figure 2A:
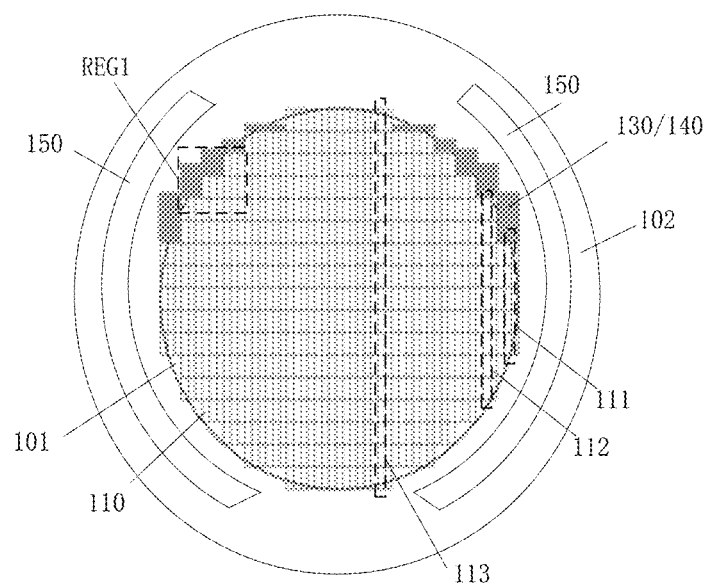
FIG. 2A is a schematic diagram of a compensation mode of the display substrate shown in FIG. 1A provided by some embodiments of the present disclosure.
Figure 3:
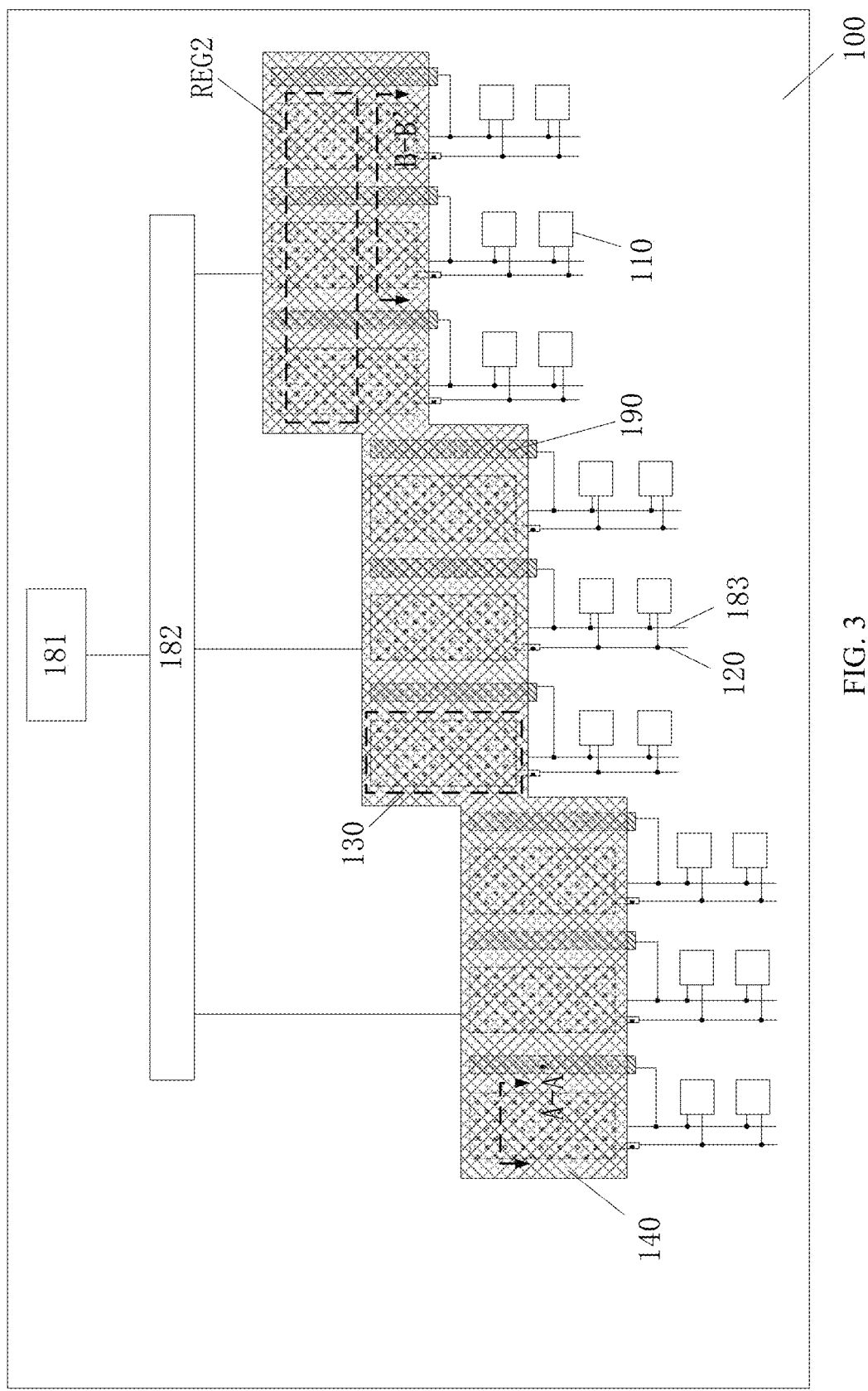
FIG. 3 is a schematic diagram of a partial structure of a display substrate provided by some embodiments of the present disclosure.

FIG. 2A is a schematic diagram of a compensation mode of the display substrate shown in FIG. 1A provided by some embodiments of the present disclosure; FIG. 3 is a schematic diagram of a partial structure of a display substrate provided by some embodiments of the present disclosure, for example, FIG. 3 corresponds to the region REG1 shown in FIG. 2A.

For example, as shown in FIGS. 1A, 2A and 3, the display substrate 10 includes a base substrate 100. The display region 101 includes a plurality of pixel units 110 arranged in an array on the base substrate 100 and a plurality of signal lines 120 respectively electrically connected to the pixel units 110. The peripheral region 102 includes at least one first electrode pattern 130 electrically connected with at least one of the plurality of signal lines 120, and includes a second electrode pattern 140. The first electrode pattern 130 and the second electrode pattern 140 at least partially overlap in a direction perpendicular to the substrate surface of the base substrate 100 and are spaced apart from and insulated from each other to form a capacitor, thus, the transmission loads on the signal lines 120 electrically connected to the first electrode pattern 130 (for example, the transmission load on the signal lines 120 may refer to the transmission resistance of the signal lines 120, or the capacitor formed between the signal lines 120 and other wires) are compensated through the capacitor formed between the first electrode pattern 130 and the second electrode pattern 140, thereby increasing the consistency of the transmission loads on the plurality of signal lines 120 in the display region 101. As a result, the signal transmission effect of the plurality of signal lines 120 in the display region 101 can be increased, and the brightness uniformity and consistency of display images produced by the display substrate can be increased, thereby weakening or avoiding the abnormal or bad phenomenon of the display images, and increasing the display effect of the display images.

In some embodiments of the present disclosure, the signal line 120 is a scanning line, for example, for providing a gate scanning signal to the pixel unit 110, or a data line, for example, for providing a data signal to the pixel unit 110, or a signal line for providing other electrical signals required for realizing image display to the pixel unit 110.

For example, in the case where the signal line 120 is a scanning line, the transmission load on the scanning line electrically connected with the first electrode pattern 130 is compensated by the capacitor formed between the first electrode pattern 130 and the second electrode pattern 140, thereby increasing the transmission effect of a single, for example a gate scanning signal, transmitted on the scanning line, and improving the consistency of the transmission effect of gate scanning signals on the plurality of scanning lines in the display region 101.

For example, in the case where the signal line 120 is a data line, the transmission load on the data line electrically connected with the first electrode pattern 130 is compensated by the capacitor formed between the first electrode pattern 130 and the second electrode pattern 140, thereby increasing the transmission effect of a data signal transmitted on the data line, and increasing the consistency of transmission effect of data signals on the plurality of data lines in the display region 101.

The following embodiments of the present disclosure are illustrated by taking the case where the signal line 120 is the data line, but it should be noted that the embodiments of the present disclosure include but are not limited to this case.

For example, as shown in FIGS. 1A, 2A and 3, the peripheral region 102 further includes a gate scan driving circuit (for example, a Gate-On-Array (GOA)) 150, the gate scan driving circuit 150 is configured to provide a gate scanning signal to the plurality of pixel units 110, for example, the gate scan driving circuit 150 is directly fabricated on the base substrate 100 by a semiconductor process. In a direction parallel to the substrate surface of the base substrate 100, the first electrode pattern 130 and the second electrode pattern 140 are located between the gate scan driving circuit 150 and the display region 101, so that the space utilization ratio of the peripheral region 102 can be increased, and the space occupied by the first electrode pattern 130 and the second electrode pattern 140 in the display substrate 10 can be reduced, thereby facilitating the narrow bezel design of the display substrate 10.

For example, the gate scan driving circuit 150 includes a plurality of cascaded shift register units, for example, an output end of each shift register unit is electrically connected with a row of pixel units 110 in the display region 101 through a gate line, so as to provide the gate scanning signal for multiple pixel units 110 in the row of pixel units 110. For example, the plurality of pixel units 110 are arranged in an array in the display region 101, and the gate scan driving circuit 150 is configured to provide multiple rows of pixel units 110 in the array in the display region 101 with, for example, gate scanning signals shifted row by row.

For example, the shift register unit in the above-mentioned gate scan driving circuit 150 is a 4T1C structure, that is, the 4T1C structure at least includes four transistors and one capacitor to realize the functions of signal input, signal output, register reset, etc.; alternatively, the 4T1C structure may further include more transistors and/or capacitors, for example, sub-circuits for realizing the functions of pull-up node control, pull-down node control, or noise reduction, etc. are added into the 4T1C structure, so as to realize more stable input, output and reset. The embodiments of the present disclosure impose no limitation to the specific structure of the shift register unit.

For example, in the case where the signal line 120 is the data line, the first electrode pattern 130 is electrically connected between the corresponding data line and a data driving circuit, and the data driving circuit is configured to respectively provide corresponding data signals to a plurality of columns of pixel units 110 in the display region 101, thereby realizing the transmission of data signals through the signal lines 120 and the first electrode pattern 130; for example, the first electrode pattern 130 further at least partially plays a role of transmitting data signals. For example, the data driving circuit converts digital image data input from a timing controller into the data signals by using a reference gamma voltage to and according to a plurality of data control signals from the timing controller. For example, the data driving circuit is implemented as a semiconductor chip, the semiconductor chip is mounted on a flexible printed circuit board and coupled to the data lines on the display substrate by a bonding method.

Figure 4:
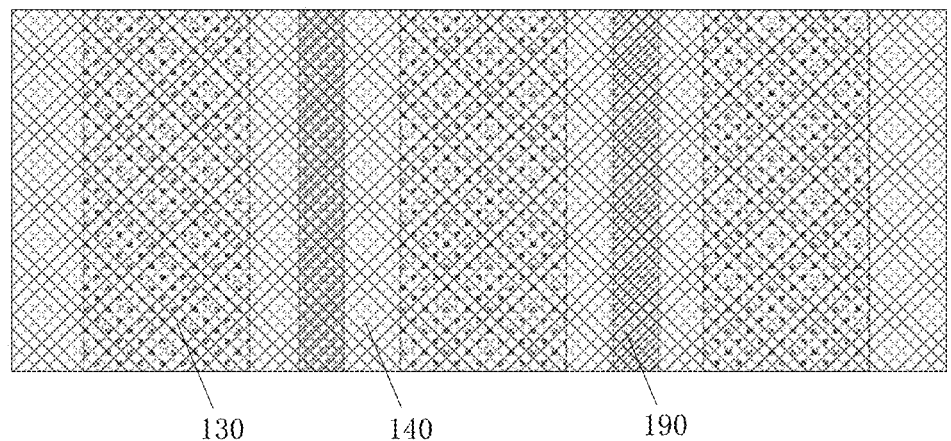
FIG. 4 is a schematic diagram of a partial planar structure of a peripheral region of a display substrate provided by some embodiments of the present disclosure.
Figure 5A:
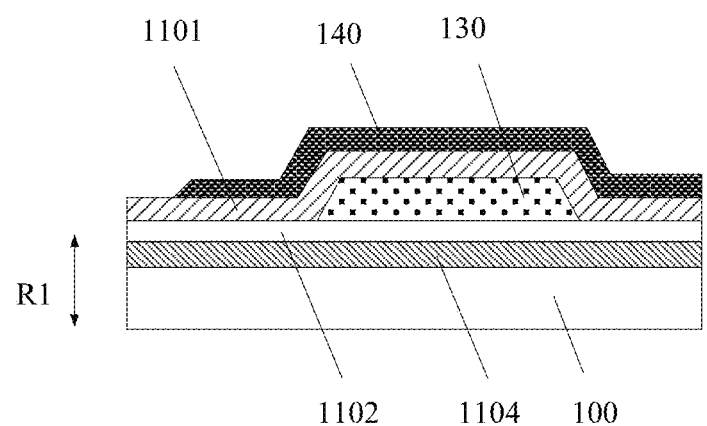
FIG. 5A is a schematic diagram of a partial cross-sectional structure of a peripheral region of a display substrate provided by some embodiments of the present disclosure.
Figure 5B:
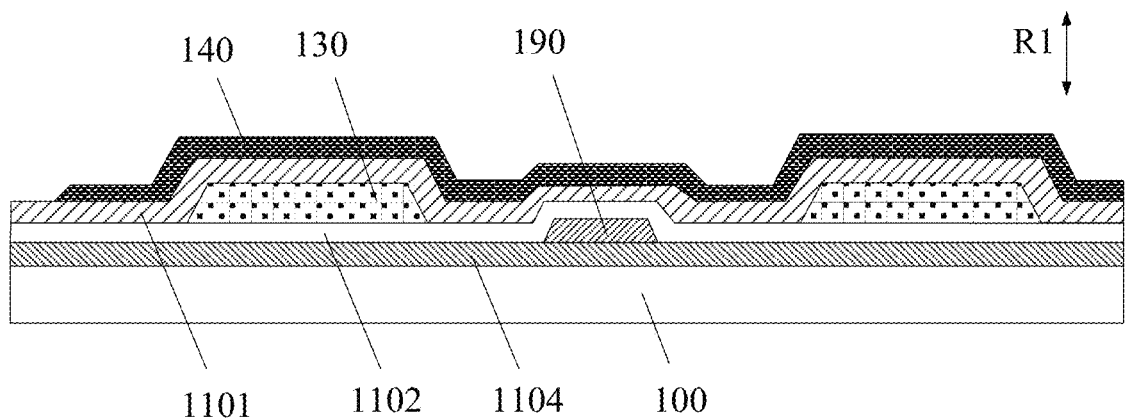
FIG. 5B is a schematic diagram of a partial cross-sectional structure of a peripheral region of another display substrate provided by some embodiments of the present disclosure.

FIG. 4 is a schematic diagram of a partial planar structure of the peripheral region of a display substrate provided by some embodiments of the present disclosure, for example, FIG. 4 corresponds to the area REG2 shown in FIG. 3. FIG. 5A is a schematic diagram of a partial cross-sectional structure of the peripheral region of a display substrate provided by some embodiments of the present disclosure. For example, FIG. 5A is a schematic diagram of a partial cross-sectional structure of the display substrate 10 taken along the line A-A' shown in FIG. 3. FIG. 5B is a schematic diagram of a partial cross-sectional structure of the peripheral region of another display substrate provided by some embodiments of the present disclosure. For example, FIG. 5B is a schematic diagram of a partial cross-sectional structure of the display substrate 10 taken along the line B-B' shown in FIG. 3.

For example, as shown in FIG. 3-FIG. 5B, an orthographic projection of the first electrode pattern 130 on the base substrate 100 is within an orthographic projection of the second electrode pattern 140 on the base substrate 100, that is, in the direction R1 perpendicular to the substrate surface of the base substrate 100, the second electrode pattern 140 completely covers the first electrode pattern 130, thus, by increasing the overlapping area of the first electrode pattern 130 and the second electrode pattern 140 in the direction R1 perpendicular to the substrate surface of the base substrate 100, the capacitance of the compensation capacitor formed between the first electrode pattern 130 and the second electrode pattern 140 is increased, so that the stable capacitance can be formed between the first electrode pattern 130 and the second electrode pattern 140. Thus, the compensation effect of the transmission load of the signal line 120 can be further increased, and the stability and consistency of the signal transmission effect of the plurality of signal lines 120 in the display region 101 can be further increased.

It should be noted that, in some embodiments of the present disclosure, in order to improve the electrical connection effect between the first electrode pattern 130 and the signal line 120, a connector for realizing the electrical connection between the first electrode pattern 130 and the signal line 120 is provided between the two. For example, the connector is located in the same layer as the first electrode pattern 130 or the signal lines 120, or in a layer different from the first electrode pattern 130 and the signal lines 120, which is not limited by the embodiments of the present disclosure.

For example, in some embodiments shown in FIG. 3, the first electrode pattern 130 extends linearly and is in a strip shape; however, in other embodiments of the present disclosure, the first electrode pattern 130 extends in a curved shape, a fold line shape or other suitable contour, and the shape of the first electrode pattern 130 may take the form of, for example, an ellipsoid shape, a square shape, a zigzag shape or other suitable regular shape or irregular shape according to actual needs. The embodiments of the present disclosure impose no limitation to this.

For example, as shown in FIG. 3-FIG. 5B, the second electrode pattern 140 is located on a side of the first electrode pattern 130 away from the base substrate 100, so that the second electrode pattern 140 plays a role of shielding the electric field and the interference, caused by other structures or devices located on a side of the second electrode pattern 140 away from the base substrate 100 in the display substrate 10, to the electrical signals transmitted on the first electrode pattern 130 can be weakened or avoided, thus the stability of the electrical signal transmitted on the signal line 120 electrically connected with the first electrode pattern 130 is increased.

Figure 6:
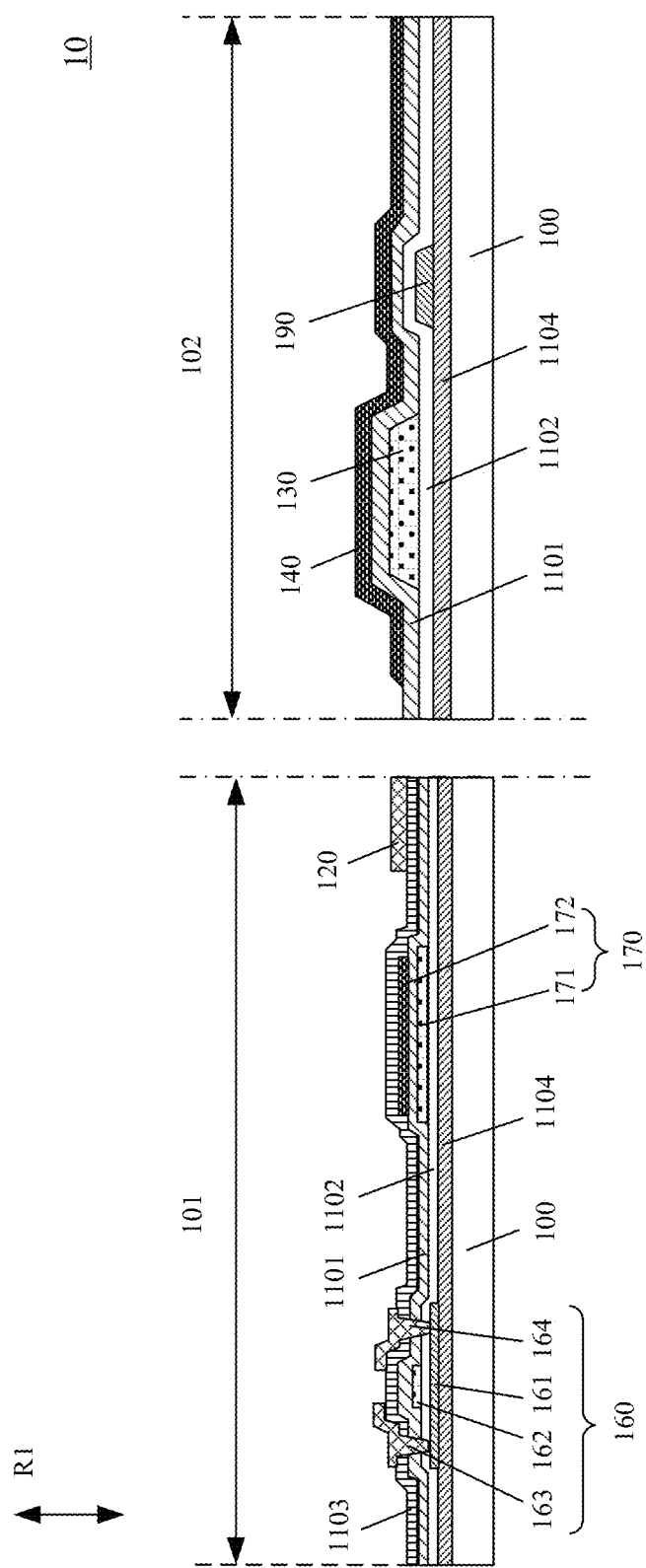
FIG. 6 is a schematic diagram of a partial cross-sectional structure of a display region and a partial cross-sectional structure of a peripheral region of the display substrate provided by some embodiments of the present disclosure.

FIG. 6 is a schematic diagram of a partial cross-sectional structure of the display region and a partial cross-sectional structure of the peripheral region of a display substrate provided by some embodiments of the present disclosure. For example, the cross-sectional structure of the display substrate 10 shown in FIG. 6 includes the cross-sectional structure of the peripheral region 102 of the display substrate 10 shown in FIG. 5A or the partial cross-sectional structure of the peripheral region 102 of the display substrate 10 shown in FIG. 5B, and further includes a partial cross-sectional structure of the display region 101 of the display substrate 10, such as a partial cross-sectional structure of the pixel driving circuit of one pixel unit 110 in the display region 101.

For example, as shown in FIG. 3-FIG. 6, at least one of the plurality of pixel units 110 (e.g., each pixel unit 110) includes a pixel driving circuit located on the base substrate 100, and the pixel driving circuit includes a thin film transistor 160 and a storage capacitor 170. The thin film transistor 160 includes an active layer 161, a gate electrode 162, a source electrode 163 and a drain electrode 164, and the storage capacitor 170 includes a first capacitor electrode 171 and a second capacitor electrode 172 opposite to the first capacitor electrode 171 in the direction R1 perpendicular to the substrate surface of the base substrate 100. The source electrode 163 and the drain electrode 164 are located on a side of the active layer 161 away from the base substrate 100.

For example, the first electrode pattern 130, the gate electrode 162 and the first capacitor electrode 171 are arranged in a same layer, and the second electrode pattern 140 and the second capacitor electrode 172 are arranged in a same layer. In this way, by forming the first electrode pattern 130, the gate electrode 162 and the first capacitor electrode 171 in the same layer in the manufacturing process (for example, the first electrode pattern 130, the gate electrode 162 and the first capacitor electrode 171 are formed by a patterning process performed on a same material layer), and forming the second electrode pattern 140 and the second capacitor electrode 172 in the same layer in the manufacturing process, the manufacturing process of the display substrate 10 can be simplified, and the manufacturing cost of the display substrate 10 can be reduced, which is beneficial to mass production and application of the display substrate 10.

It should be noted that, in the embodiment of the present disclosure, the term "arranged in a same layer" means that two functional layers or structural layers are in the same layer in the layer-stacked structure of the display substrate and made from the same material, that is, in the manufacturing process, the two functional layers or structural layers are formed by the same material layer, and the required pattern and structure can be formed by one same patterning process, for example, the material layer is first formed, and then the two functional layers or structural layers are formed by using the material layer through one same patterning process.

For example, the display substrate 10 further includes a first insulation layer 1101 located between the first electrode pattern 130 and the second electrode pattern 140. A material of the first insulation layer 1101 may include, for example, silicon nitride or silicon oxynitride, or other insulating materials with a high dielectric constant. Thus, by using an insulating material with the high dielectric constant (such as silicon nitride or silicon oxynitride) as the first insulation layer 1101 between the first electrode pattern 130 and the second electrode pattern 140, a compensation capacitor with a larger capacitance can be formed between the first electrode pattern 130 and the second electrode pattern 140, so that the sizes of the first electrode pattern 130 and the second electrode pattern 140 can be reduced. Thus, the space occupied by the first electrode pattern 130 and the second electrode pattern 140 in a plane parallel to the base substrate 100 can be further reduced, which is beneficial to the narrow bezel design of the display substrate 10.

For example, the first insulation layer 1101 is located between the first electrode pattern 130 and the second electrode pattern 140, that is, between the first capacitor electrode 171 and the second capacitor electrode 172, so that not only the capacitance of the compensation capacitor formed between the first electrode pattern 130 and the second electrode pattern 140 but also the capacitance of the storage capacitor formed between the first capacitor electrode 171 and the second capacitor electrode 172 can be increased by the first insulation layer 1101, thereby increasing the overall performance of the display substrate 10 and enhancing the stability of the display substrate 10.

For example, the display substrate 10 further includes a buffer layer 1104, a second insulation layer 1102 and a third insulation layer 1103. The buffer layer 1104 is located on the base substrate 100; the active layer 161 is located on a side of the buffer layer 1104 away from the base substrate 100; the second insulation layer 1102 is located on a side of the active layer 161 away from the base substrate 100; and the first electrode pattern 130, the gate electrode 162 and the first capacitor electrode 171 are located on a side of the second insulation layer 1102 away from the base substrate 100. The first insulation layer 1101 is located on a side of the first electrode pattern 130, the gate electrode 162 and the first capacitor electrode 171 away from the base substrate 100; the second electrode pattern 140 and the second capacitor electrode 172 are located on a side of the first insulation layer 1101 away from the base substrate 100; the third insulation layer 1103 is located on a side of the second electrode pattern 140 and the second capacitor electrode 172 away from the base substrate 100; and the source electrode 163 and the drain electrode 164 are located on a side of the third insulation layer 1103 away from the base substrate 100.

For example, as shown in FIG. 6, the plurality of signal lines 120 are arranged in the same layer as the source electrode 163 and drain electrode 164 of the thin film transistor 160, and the first electrode pattern 130 is electrically connected to the signal lines 120 through, for example, a via hole structure penetrating through the first insulation layer 1101 and the third insulation layer 1103, thereby realizing the compensation of the transmission load of the signal lines 120.

For example, the display substrate further includes a protection layer (not shown) on a side of the source electrode 163 and the drain electrode 164 away from the base substrate 100, and a light emitting element (not shown) on a side of the protection layer away from the base substrate 100; the source electrode 163 or the drain electrode 164 is electrically connected with the light emitting element provided on the protection layer through a via hole in the protection layer.

For example, a material of the active layer 161 includes polysilicon or oxide semiconductor (for example, indium gallium zinc oxide). The material of the gate electrode 162 may include a metal material or an alloy material, such as a metal single-layer or metal multi-layer structure formed by molybdenum, aluminum, titanium and the like, for example, the metal multi-layer structure is a multi-metal laminated layer (such as a three-layer metal laminated layer of titanium, aluminum and titanium (Al/Ti/Al)). The material of the source electrode 163 and the material of the drain electrode 164 may include a metal material or an alloy material, for example, both the source electrode 163 and the drain electrode 164 are a metal single-layer or a metal multi-layer structure formed by molybdenum, aluminum, titanium, etc. For example, the multi-layer structure is a multi-metal laminated layer (such as a three-layer metal laminated layer of titanium, aluminum and titanium (Al/Ti/Al)). The embodiments of the present disclosure are not particularly limited to the material of each structural or functional layer.

For example, the buffer layer 1104 not only prevents harmful substances in the base substrate 100 from intruding into the display substrate 10, but also increases the adhesion of layers in the display substrate 10 to the base substrate 100. For example, a material of the buffer layer 1104 includes an insulating material such as silicon oxide, silicon nitride, silicon oxynitride, and the like. For example, a material of one or more selected from a group consisting of the first insulation layer 1101, the second insulation layer 1102, the third insulation layer 1103 and the protection layer includes an insulating material such as silicon oxide, silicon nitride, silicon oxynitride and the like. The materials of the first insulation layer 1101, the second insulation layer 1102, the third insulation layer 1103, the buffer layer 1104 and the protection layer are the same or different from each other, and the embodiments of the present disclosure impose no limitation to this.

It should be noted that FIG. 6 shows an example where the thin film transistor 160 is a bottom-gate thin film transistor, but in other embodiments of the present disclosure, the thin film transistor 160 is a top-gate thin film transistor or other suitable types of thin film transistor, and the embodiments of the present disclosure impose no limitation to this.

It should be noted that the specific description of the pixel driving circuit of the display substrate 10 is referred to the content of a specific example of the pixel driving circuit shown in FIG. 7 and FIGS. 8A-8E, which is not repeated here.

In some embodiments of the present disclosure, as shown in FIGS. 3-6, the display substrate 10 further includes a first voltage source electrode 181, and the second electrode pattern 140 is configured to receive a first voltage signal from the first voltage source electrode 181, so that the second electrode pattern 140 has a stable voltage, thereby increasing the stability of the compensation capacitor formed between the first electrode pattern 130 and the second electrode pattern 140, and the interference, caused by other structures or devices of the display substrate 10 on the side of the second electrode pattern 140 away from the base substrate 100, to the electric signal transmitted on the first electrode pattern 130 is further weakened or avoided by the first voltage signal. For example, the first voltage signal is a high-level voltage signal or a low-level voltage signal, and the embodiments of the present disclosure impose no limitation to this.

For example, as shown in FIGS. 3-6, the peripheral region 102 further includes a power wire pattern 182. The power wire pattern 182 is electrically connected with the first voltage source electrode 181, and the second electrode pattern 140 is electrically connected with the power wire pattern 182 to receive the first voltage signal through the power wire pattern 182. Thus, the layout structure of the display substrate 10 is changed, thereby facilitating the narrow bezel design of the display substrate 10, and simplifying the manufacturing process of the display substrate 10.

For example, in some examples, in the direction parallel to the substrate surface of the base substrate 100, the power wire pattern 182 is located between the first voltage source electrode 181 and the second electrode pattern 140, or located on a side of the first voltage source electrode 181 and the second electrode pattern 140 away from the display region 101; alternatively, in some examples, the power wire pattern 182 at least partially overlaps the second electrode pattern 140 in the direction perpendicular to the substrate surface of the base substrate 100, and the embodiments of the present disclosure impose no limitation to this.

For example, the power wire pattern 182 is located in the same layer as the source electrode 163 and the drain electrode 164 of the thin film transistor 160, and the second electrode pattern 140 is electrically connected with the power wire pattern 182 through a via hole structure penetrating through the third insulation layer 1103, thereby optimizing the layout structure in the peripheral region 102 of the display substrate 10.

For example, in the direction parallel to the substrate surface of the base substrate 100, at least part (e.g., a whole) of the second electrode pattern 140 are electrically connected between the power wire pattern 182 and the plurality of pixel units 110, and the power wire pattern 182 provides the first voltage signal to at least part of the plurality of pixel units 110 through the second electrode pattern 140. In this way, while the second electrode pattern 140 and the first electrode pattern 130 form a compensation capacitor to compensate the transmission load on the signal line 120 electrically connected with the first electrode pattern 130, the second electrode pattern 140 is further used to transmit the power voltage signal (i.e., the first voltage signal) for display, so that the layout structure of the display substrate 10 can be further optimized, the narrow bezel design of the display substrate 10 can be facilitated, and the stability of the display substrate 10 can also be increased.

For example, as shown in FIG. 3, the second electrode pattern 140 is electrically connected with a plurality of first power lines 183 in the display region 101 to transmit the first voltage signal provided by the first voltage source electrode 181 into the pixel unit 110 through the first power lines 183. For example, the first power line 183 is disposed in the same layer as the source electrode 163 and the drain electrode 164 of the thin film transistor 160, and the second electrode pattern 140 is electrically connected to the first power line 183 through, for example, a via hole structure penetrating through the third insulation layer 1103.

For example, as shown in FIGS. 3-6, the peripheral region 102 of the display substrate 10 includes a plurality of first electrode patterns 130, and the plurality of first electrode patterns 130 are arranged at intervals. For example, in the direction parallel to the substrate surface of the base substrate 100, the peripheral region 102 further includes a spacer pattern 190 which is located between two adjacent first electrode patterns 130 and is insulated from the first electrode patterns 130. The spacer pattern 190 can reduce or avoid signal interference between the adjacent first electrode patterns 130 and increase the stability of the electric signal transmitted on the first electrode patterns 130.

In some embodiments of the present disclosure, the spacer pattern 190 is configured to receive a second voltage signal from a second voltage source different from the first voltage source, so that the spacer pattern 190 and the adjacent first electrode patterns 130 can form capacitors in a plane parallel to the substrate surface of the base substrate 100, thereby further increasing the compensation effect of the transmission load on the signal line 120 electrically connected with the first electrode pattern 130, and further increasing the stability and consistency of the signal transmission effect of a plurality of signal lines 120 in the display region 101.

In some embodiments of the present disclosure, the spacer pattern 190 is electrically connected with the second electrode pattern 140 to receive the first voltage signal from the first voltage source electrode 181, so that the layout structure in the peripheral region 102 of the display substrate 10 can be further optimized on the basis of allowing the spacer pattern 190 and the adjacent first electrode patterns 130 to form capacitors in the plane parallel to the substrate surface of the base substrate 100, which is beneficial to the narrow bezel design of the display substrate 10.

For example, as shown in FIG. 3, the spacer pattern 190 is electrically connected to the second electrode pattern 140 through the first power line 183. The spacer pattern 190 is arranged in the same layer as the active layer 161 of the thin film transistor 160, and is electrically connected with the first power line 183 through a via structure penetrating through at least the first insulation layer 1101, the second insulation layer 1102 and the third insulation layer 1103, so as to be further electrically connected with the second electrode pattern 140. Thus, the spacer pattern 190 and the active layer 161 of the thin film transistor 160 are formed in the same layer in the manufacturing process (for example, the spacer pattern 190 and the active layer 161 of the thin film transistor 160 are formed by the same material layer by a patterning process), so that the manufacturing process of the display substrate 10 can be further simplified and the manufacturing cost of the display substrate 10 can be reduced, which is beneficial to mass production and application of the display substrate 10.

In the embodiment of the present disclosure, the spacer pattern 190 extends linearly and is in a strip shape; however, in other embodiments of the present disclosure, the spacer pattern 190 extends in a curved shape, a fold line shape or other suitable contour, and the shape of the spacer pattern 190 may take the form of, for example, an ellipsoid shape, a square shape, a zigzag shape or other suitable regular shape or irregular shape according to actual needs. The embodiments of the present disclosure impose no limitation to this.

For example, taking the case where the spacer pattern 190 in the strip shape shown in FIGS. 3-6 as an example, in the extending direction of the spacer pattern 190, the spacer pattern 190 includes a first end and a second end that are opposite to each other, and the first end is closer to the display region 101 than the second end. The first end of the spacer pattern 190 is electrically connected to the first power line 183, for example, through a via hole structure penetrating through at least the first insulation layer 1101, the second insulation layer 1102 and the third insulation layer 1103, and further electrically connected to the second electrode pattern 140, so as to receive the first voltage signal; the second end of the spacer pattern 190 is in a suspended state, so that the corresponding via hole structure does not need to be provided, thereby reducing the number of via holes to be provided in the display substrate 10 and further simplifying the manufacturing process of the display substrate 10. Alternatively, in other examples of the present disclosure, the first end and the second end of the spacer pattern 190 are both electrically connected with the first power line 183 or the second electrode pattern 140 through a via hole structure to simultaneously receive the first voltage signal, thereby increasing the stability of the first voltage signal transmitted on the spacer pattern 190, which is not limited by the embodiments of the present disclosure.

In some embodiments of the present disclosure, because the peripheral region 102 provided with the spacer pattern 190 at least partially surrounds the display region 101 and is arranged along the edge of the display region 101, by providing the spacer pattern 190 in the same layer as the active layer 161 of the thin film transistor 160, the over-etching of the part of the active layer close to the edge of the display region 101 in the manufacturing process of the display substrate 10 can be weakened or avoided, so that the etching uniformity at the boundary position of the display region 101 can be increased and better etching effect can be achieved.

For example, as shown in FIGS. 3-6, the second electrode pattern 140 is continuously arranged along the edge of the display region 101, and the second electrode pattern 140 at least partially overlaps with the plurality of first electrode patterns 130 in the direction R1 perpendicular to the substrate surface of the base substrate 100 and is spaced apart from and insulated from the first electrode patterns 130, so that the consistency and stability of the first voltage signal transmitted on the second electrode pattern 140 can be increased, thereby increasing the consistency and stability of the plurality of compensation capacitors respectively formed between the second electrode pattern 140 and the plurality of first electrode patterns 130, and further increasing the signal transmission effect of the signal lines 120 electrically connected with the first electrode patterns 130. Moreover, the continuously arranged second electrode pattern 140 is also helpful for simplifying the manufacturing process of the display substrate 10 and reducing the manufacturing cost of the display substrate 10, which is beneficial to the mass production and application of the display substrate 10.

For example, taking the specific example of the display substrate 10 shown in FIG. 2A as an example, the second electrode pattern 140 is continuously arranged along the edge of the display region 101 and is in a stepped shape, that is, in the stepped shape, the electrode patterns at an upper step and a lower step that are adjacent to each other are connected to each other, thereby forming a whole piece of the second electrode pattern 140, and in this way, the voltage drop when the first voltage signal is transmitted through the second electrode patterns 140 can be reduced, and the brightness uniformity and consistency of the display images can be further increased.

For example, as shown in FIG. 2A, the plurality of pixel units 110 include a first column of pixel units 111 and a second column of pixel units 112, the number of pixel units 110 in the first column of pixel units 111 is less than that in the second column of pixel units 112; and the signal line 120 electrically connected with the first column of pixel units 111 is electrically connected with one first electrode pattern 130. Thus, the compensation capacitor formed between the one first electrode pattern 130 and the second electrode pattern 140 compensates the transmission load of the signal line 120 electrically connected to the first column of pixel units 111, and increases the signal transmission effect on the signal line 120, so that the signal transmission effect on the signal line 120 is basically consistent with that of other signal lines 120 (for example, the signal line 120 electrically connected to the second column of pixel units 112).

For example, the signal line 120 electrically connected to the second column of pixel units 112 is electrically connected to another first electrode pattern 130, and an amount of the compensation capacitance formed between the second electrode pattern 140 and one first electrode pattern 130 (the one first electrode pattern 130 is electrically connected to the signal line 120 which is electrically connected to the first column pixel unit 111) is larger than an amount of the compensation capacitance formed between the second electrode pattern 140 and another first electrode pattern 130 (the another first electrode pattern 130 is electrically connected to the signal line 120 which is electrically connected to the second column pixel unit 112). Thus, the consistency and stability between the signal transmission effect of the signal line 120 electrically connected to the first column pixel unit 111 and the signal line 120 electrically connected to the second column pixel unit 112 can be increased by using different amounts of the compensation capacitance to respectively compensate the transmission load of the signal line 120 electrically connected to the first column of pixel units 111 and the transmission load of the signal line 120 electrically connected to the second column of pixel units 112. Thus, the consistency and stability of the signal transmission effects of the plurality of signal lines 120 in the display region 101 can be increased, and the display effect of the provided display screen can be increased, and the display abnormality or bad phenomenon of the display screen can be weakened or avoided.

For example, the plurality of pixel units 110 further include a third column of pixel units 113, which can provide load compensation for the signal lines 120 electrically connected to the first column pixel unit 111 and the second column pixel unit 112, taking the transmission load of the signal lines 120 electrically connected to the third column pixel unit 113 as a standard or as a reference, so that the compensated transmission loads of the signal lines 120 electrically connected with the first column of pixel units 111 and the second column of pixel units 112 are basically the same as those of the signal lines 120 electrically connected with the third column of pixel units 113, so that the transmission loads of the signal lines 120 electrically connected with all the columns of pixel units 110 in the display substrate 10 are basically consistent, thereby increasing the consistency of signal transmission effects of all the signal lines 120 in the display region 101 and increasing the display effect of the display images.

For example, the length of the first electrode pattern 130 in a column direction and the length of the second electrode pattern 140 in the column direction are different, or the length of the first electrode pattern 130 in a row direction and the length of the second electrode pattern 140 in the row direction are different. For example, the length of the first electrode pattern 130 in the column direction and the length of the second electrode pattern 140 in the column direction or the row direction are designed to provide different load compensation. For example, taking the case where the data signals provided to each column of pixel units 110 in the display region 101 through the signal lines 120 as an example, for a column with a small number of pixel units 110, it is necessary to provide a large amount of load compensation to the signal line 120 electrically connected to the column of pixel units 110, so the first electrode pattern 130 and the second electrode pattern 140 need to have a large length in the column direction or the row direction, that is, the smaller the number of pixel units 110 included in a column, the larger the load compensation amount of the signal line 120 electrically connected with the column of pixel units 110 is required to be provided. Thus, the first electrode pattern 130 and the second electrode pattern 140 can be flexibly arranged in the peripheral region 102, and the layout structure in the peripheral region 102 of the display substrate 10 can be further optimized.

Figure 2B:
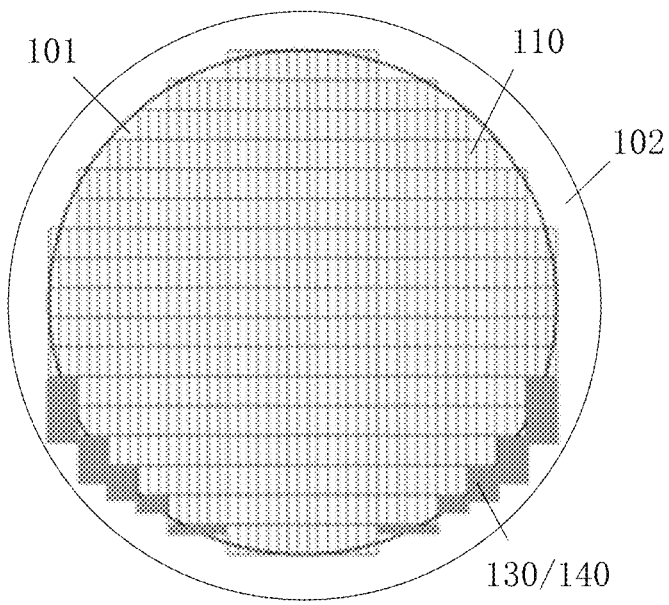
FIG. 2B is a schematic diagram of another compensation mode of the display substrate shown in FIG. 1A provided by some embodiments of the present disclosure.
Figure 2C:
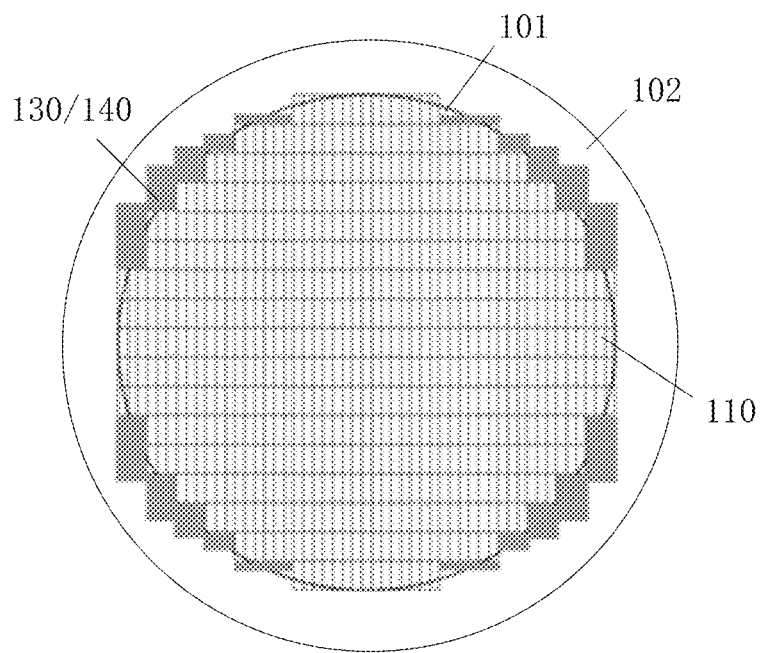
FIG. 2C is a schematic diagram of yet another compensation mode of the display substrate shown in FIG. 1A provided by some embodiments of the present disclosure.

For example, in the case where the transmission load on the signal line 120 electrically connected to the first electrode pattern 130 is compensated by the compensation capacitor formed between the first electrode pattern 130 and the second electrode pattern 140, according to the required compensation amount, the first end or the second end of the signal line 120 may be electrically connected to one first electrode pattern 130 as shown in FIG. 2A or FIG. 2B, or, the first end of the signal line 120 is electrically connected with one first electrode pattern 130 and the second end of the signal line 120 is electrically connected with another first electrode pattern 130, that is, the two ends of the signal line 120 are respectively electrically connected with two first electrode patterns 130 as shown in FIG. 2C, so as to improve the load compensation amount. The embodiments of the present disclosure are not limited to this case.

In some embodiments of the present disclosure, an extension direction of at least part of the edge of the display region 101 of the display substrate 10 intersects and is not perpendicular to an extension direction of the signal line 120. For example, according to the actual requirements of the user for the shape of the display substrate 10, the display substrate 10 with different shapes or contours can be designed, the shape is not limited to a single square-shaped display substrate with right angles.

For example, the display substrate provided by the embodiments of the present disclosure, such as the display substrate 10 or the display substrate 20, is an organic light emitting diode display substrate.

For example, the display substrate provided by the embodiments of the present disclosure is also a substrate with display function, such as a quantum dot light emitting diode display substrate, an electronic paper display substrate, or other types of display substrates, and the embodiments of the present disclosure are not limited to this case.

Figure 7:
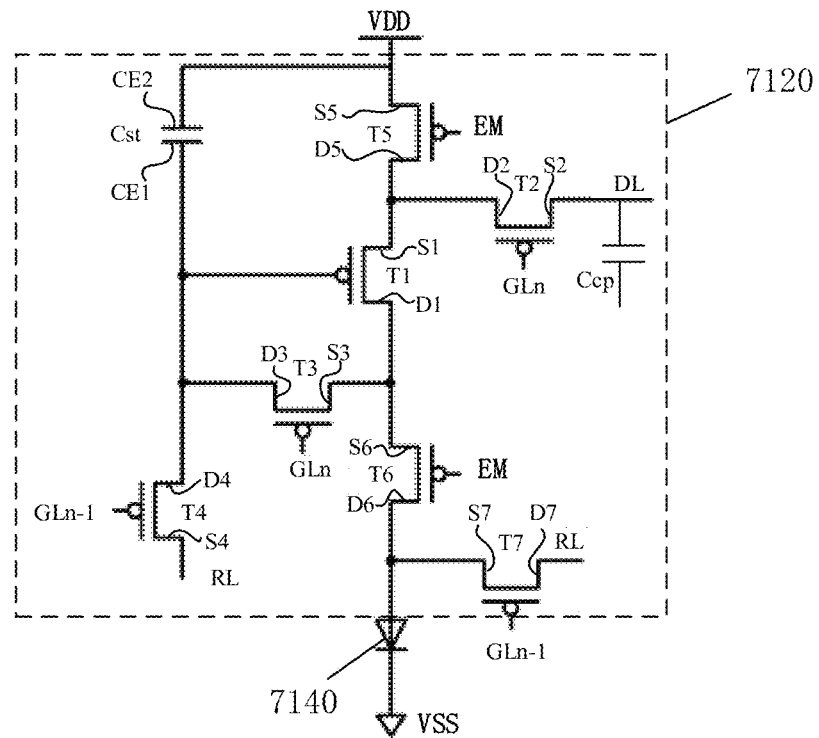
FIG. 7 is an equivalent circuit diagram of a pixel driving circuit in a display substrate provided by some embodiments of the present disclosure.
Figure 8A:
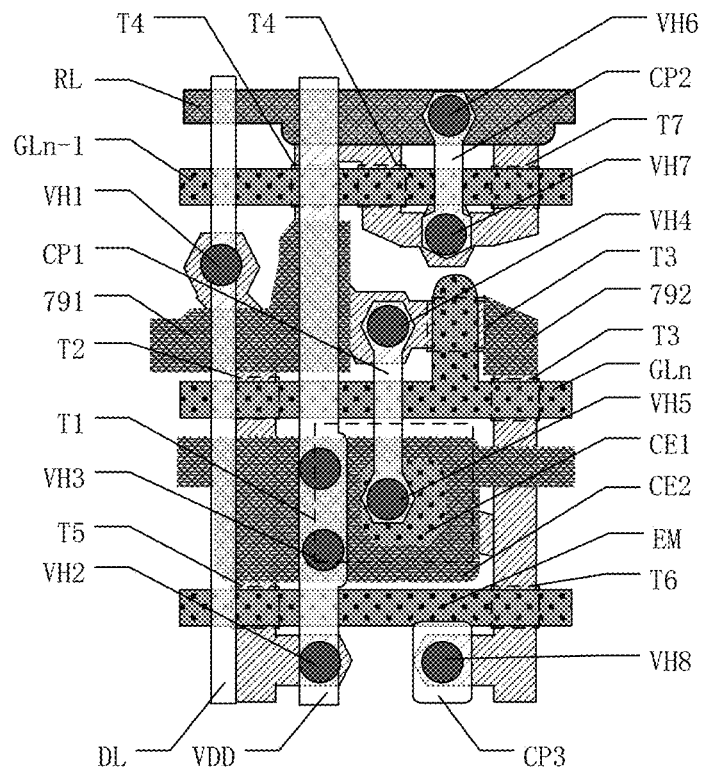
FIGS. 8A-8E are schematic diagrams of various layers of a pixel driving circuit in a display substrate provided by some embodiments of the present disclosure.

FIG. 7 is an equivalent circuit diagram of a pixel driving circuit in a display substrate provided by some embodiments of the present disclosure, and FIGS. 8A-8E are schematic diagrams of various layers of a pixel driving circuit in a display substrate provided by some embodiments of the present disclosure. For example, the storage capacitor 170 shown in FIG. 6 is the storage capacitor Cst in the pixel driving circuit 7120 shown in FIGS. 7 and 8A, and the thin film transistor 160 shown in FIG. 6 is at least one of a plurality of thin film transistors T1, T2, T3, T4, T5, T6 and T7 in the pixel driving circuit 7120 shown in FIGS. 7 and 8A. It should be noted that the specific structure of the pixel driving circuit 7120 shown in FIG. 7 and FIG. 8A is only an example, and the embodiments of the present disclosure include but are not limited to this case.

In some embodiments, as shown in FIG. 7, the pixel driving circuit 7120 includes a plurality of thin film transistors T1, T2, T3, T4, T5, T6 and 17, a plurality of signal lines connected to the plurality of thin film transistors T1, T2, T3, T4, T5, T6 and T7 (including, for example, the signal lines 120 in the above-mentioned embodiment) and a storage capacitor Cst, and the plurality of signal lines include a gate line GL, a light emission control line EM, an initialization line RL, a data line DL and a first power line VDD (for example, the first power line 183 in the above embodiment), etc. The gate line GL for example includes a first gate line GLn and a second gate line GLn-1, for example, the first gate line GLn is configured to transmit a gate scanning signal, and the second gate line GLn-1 is configured to transmit a reset signal. The lighting control line EM is configured to transmit a lighting control signal. In this way, the pixel driving circuit 7120 is a 7T1C pixel driving circuit.

For example, taking the case where the signal line 120 is the data line DL in the above embodiment as an example, the transmission load of the data line DL electrically connected with the first electrode pattern 130 is compensated by the compensation capacitor Ccp formed between the first electrode pattern 130 and the second electrode pattern 140, thereby increasing the compensation effect of the data signal transmitted on the data line DL.

For example, the first power line VDD is directly electrically connected to the power wire pattern 182 in the above embodiment to receive the first voltage signal provided by the first voltage source electrode 181, or is electrically connected to the power wire pattern 182 by being electrically connected to the second wire pattern 140 in the above embodiment.

It should be noted that the embodiments of the present disclosure include but are not limited to this case, and the pixel driving circuit 7120 may adopt other types of circuit structures, such as a 7T2C structure or a 9T2C structure, and the embodiments of the present disclosure impose no limitation to the type of the pixel driving circuit.

For example, as shown in FIG. 7, the first gate electrode G1 of the first thin film transistor T1 is electrically connected with the third drain electrode D3 of the third thin film transistor T3 and the fourth drain electrode D4 of the fourth thin film transistor T4. The first source electrode S1 of the first thin film transistor T1 is electrically connected with the second drain electrode D2 of the second thin film transistor T2 and the fifth drain electrode D5 of the fifth thin film transistor T5. The first drain electrode D1 of the first thin film transistor T1 is electrically connected with the third source electrode S3 of the third thin film transistor T3 and the sixth source electrode S6 of the sixth thin film transistor T6.

For example, as shown in FIG. 7, the second gate electrode G2 of the second thin film transistor T2 is configured to be electrically connected with the first gate line GLn to receive the gate scanning signal, the second source electrode S2 of the second thin film transistor T2 is configured to be electrically connected with the data line DL to receive the data signal, and the second drain electrode D2 of the second thin film transistor T2 is electrically connected with the first source electrode S1 of the first thin film transistor T1.

For example, as shown in FIG. 7, the third gate electrode G3 of the third thin film transistor T3 is electrically connected to the first gate line GLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode G1 of the first thin film transistor T1.

For example, as shown in FIG. 7, the fourth gate electrode G4 of the fourth thin film transistor T4 is configured to be electrically connected to the second gate line GLn-1 to receive the reset signal, the fourth source electrode S4 of the fourth thin film transistor T4 is configured to be electrically connected to the initialization line RL to receive the initialization signal, and the fourth drain electrode D4 of the fourth thin film transistor T4 is electrically connected to the first gate electrode G1 of the first thin film transistor T1.

For example, as shown in FIG. 7, the fifth gate electrode G5 of the fifth thin film transistor T5 is configured to be electrically connected with the light emission control line EM to receive the light emission control signal, the fifth source electrode S5 of the fifth thin film transistor T5 is configured to be electrically connected with the first power line VDD to receive the first power supply signal, and the fifth drain electrode D5 of the fifth thin film transistor T5 is electrically connected with the first source electrode S1 of the first thin film transistor T1.

For example, as shown in FIG. 7, the sixth gate electrode G6 of the sixth thin film transistor T6 is configured to be electrically connected to the light emission control line EM to receive the light emission control signal, the sixth source electrode S6 of the sixth thin film transistor T6 is electrically connected to the first drain electrode D1 of the first thin film transistor T1, and the sixth drain electrode D6 of the sixth thin film transistor T6 is electrically connected to the first display electrode (e.g., anode) of the light emitting element.

For example, as shown in FIG. 7, the seventh gate electrode G7 of the seventh thin film transistor T7 is configured to be electrically connected to the second gate line GLn-1 to receive the reset signal, the seventh source electrode S7 of the seventh thin film transistor T7 is electrically connected to the first display electrode (e.g., anode) of the light emitting element, and the seventh drain electrode D7 of the seventh thin film transistor T7 is configured to be electrically connected to the initialization line RL to receive the initialization signal. For example, the seventh drain electrode D7 of the seventh thin film transistor T7 is electrically connected to the initialization line RL by being connected to the fourth source electrode S4 of the fourth thin film transistor T4.

For example, as shown in FIG. 7, the storage capacitor Cst includes a first capacitor electrode CE1 and a second capacitor electrode CE2 (such as the first capacitor electrode 171 and the second capacitor electrode 172 in the above embodiment). The second capacitor electrode CE2 is electrically connected to the first power line VDD, and the first capacitor electrode CE1 is electrically connected to the first gate electrode G1 of the first thin film transistor T1 and the third drain electrode D3 of the third thin film transistor T3.

For example, as shown in FIG. 7, the second display electrode (e.g., cathode) of the light emitting element is electrically connected to the second power line VSS.

It should be noted that one of the first power line VDD and the second power line VS S is a power line for providing a high voltage, and the other is a power line providing a low voltage. In the embodiment shown in FIG. 7, the first power line VDD (for example, the first power line 183 electrically connected to the first voltage source electrode 181) provides a constant first voltage (i.e., the first voltage signal), and the first voltage is a positive voltage; the second power line VSS provides a constant second voltage, and the second voltage is a negative voltage, etc. For example, in some examples, the second voltage is a ground voltage.

It should be noted that in some embodiments, the reset signal and the initialization signal is a same signal.

It should be noted that according to the characteristics of a transistor, the transistors can be divided into N-type transistors and P-type transistors. For the sake of clarity, the embodiment of the present disclosure takes the case where the transistors are P-type transistors (for example, P-type MOS transistors) as an example, that is, in the description of the present disclosure, all the first transistor T1, the second transistor T2, the third transistor T3, the fourth transistor T4, the fifth transistor T5, the sixth transistor T6 and the seventh transistor T7 are P-type transistors. However, the transistors of the embodiments of the present disclosure are not limited to P-type transistors, and those skilled in the art can realize the functions of one or more transistors in the embodiments of the present disclosure by using N-type transistors (for example, N-type MOS transistors) according to actual needs.

It should be noted that the transistors used in the embodiments of the present disclosure may be thin film transistors or field effect transistors or other switch devices with the same characteristics, and the thin film transistors may include oxide semiconductor thin film transistors, amorphous silicon thin film transistors or polysilicon thin film transistors, etc. The source electrode and the drain electrode of the transistor may be symmetrical in structure, therefore the source electrode and the drain electrode of the transistor may be distinguishable in physical structure. In the embodiments of the present disclosure, the source electrode and the drain electrode of all or part of the transistor can be interchanged as required.

For example, FIG. 8A is a schematic diagram of the stacking position relationship of the semiconductor layer, the first conductive layer, the second conductive layer and the third conductive layer of the pixel driving circuit 7120.

Figure 8B:
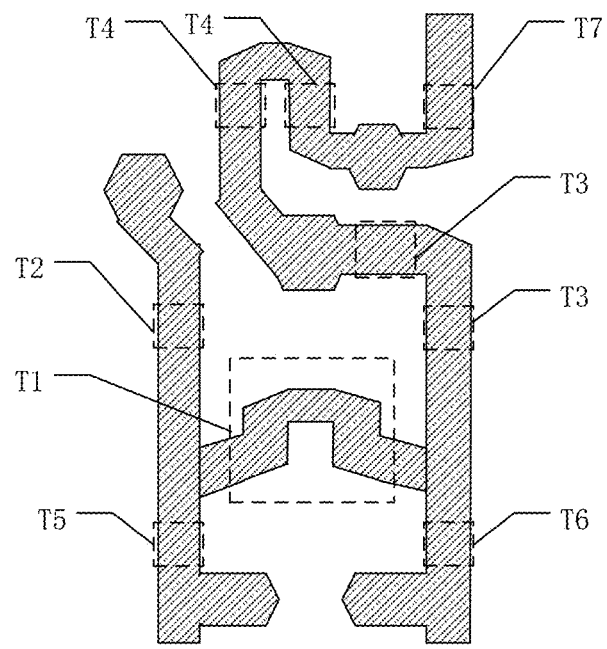

FIG. 8B shows the semiconductor layer of the pixel driving circuit 7120. As shown in FIG. 8B, the semiconductor layer is formed by patterning a semiconductor material. The semiconductor layer is used to form the active layers of the first thin film transistor T1, the second thin film transistor T2, the third thin film transistor T3, the fourth thin film transistor T4, the fifth thin film transistor T5, the sixth thin film transistor T6 and the seventh thin film transistor T7, and each active layer includes a source region, a drain region and a channel region between the source region and the drain region. For example, the semiconductor layer is made from at least one selected from a group consisting of amorphous silicon, polysilicon, oxide semiconductor material, etc. It should be noted that the above-mentioned source region and drain region may be regions doped with an N-type impurity or a P-type impurity.

For example, the active layer 161 and the spacer pattern 190 in the above-mentioned embodiments are located in the above-mentioned semiconductor layer.

In the display substrate provided by some embodiments of the present disclosure, a gate insulation layer (for example, the second insulation layer 1102 in the above embodiments, not shown in FIGS. 8A-8E) is formed on the above-mentioned semiconductor layer to protect the above-mentioned semiconductor layer.

Figure 8C:
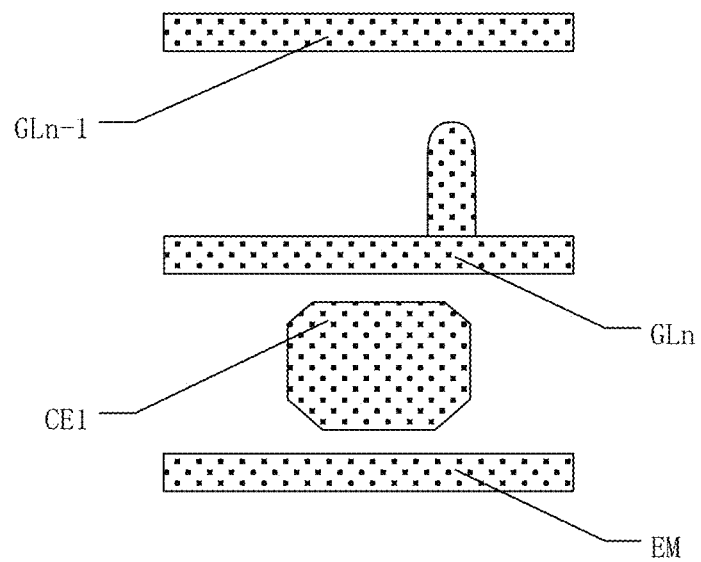

FIG. 8C shows the first conductive layer of the pixel driving circuit 7120. For example, as shown in FIG. 8C, the first conductive layer of the pixel driving circuit 7120 is disposed on the gate insulation layer so as to be insulated from the semiconductor layer shown in FIG. 8B. The first conductive layer for example includes the first capacitor electrode CE1 of the storage capacitor Cst, the first gate line GLn, the second gate line GLn-1, the light emission control line EM, and the gate electrodes of the first thin film transistor T1, the second thin film transistor T2, the third thin film transistor T3, the fourth thin film transistor T4, the fifth thin film transistor T5, the sixth thin film transistor T6 and the seventh thin film transistor T7. As shown in FIG. 8C, the gate electrodes of the second thin film transistor T2, the fourth thin film transistor T4, the fifth thin film transistor T5, the sixth thin film transistor T6 and the seventh thin film transistor T7 are the parts of the first gate line GLn and the parts of the second gate line GLn-1 that overlap with the semiconductor layer; the third thin film transistor T3 is a thin film transistor with double gate electrodes, one gate electrode of the third thin film transistor T3 is the part of the first gate line GLn overlapping with the semiconductor layer, and the other gate electrode of the third thin film transistor T3 is a protrusion part protruding from the first gate line GLn; the gate electrode of the first thin film transistor T1 is the first capacitor electrode CE1. The fourth thin film transistor T4 is a thin film transistor with double gate electrodes, and the two gate electrodes are the parts the second gate line GLn-1 overlapping with the semiconductor layer.

For example, the first electrode pattern 130, the gate electrode 162 and the first capacitor electrode 171 in the above-mentioned embodiment are located in the above-mentioned first conductive layer.

In the display substrate provided by some embodiments of the present disclosure, a first interlayer insulation layer (for example, the first insulation layer 1101 in the above embodiments, not shown in FIGS. 8A-8E) is formed on the above-mentioned first conductive layer to protect the above-mentioned first conductive layer.

Figure 8D:
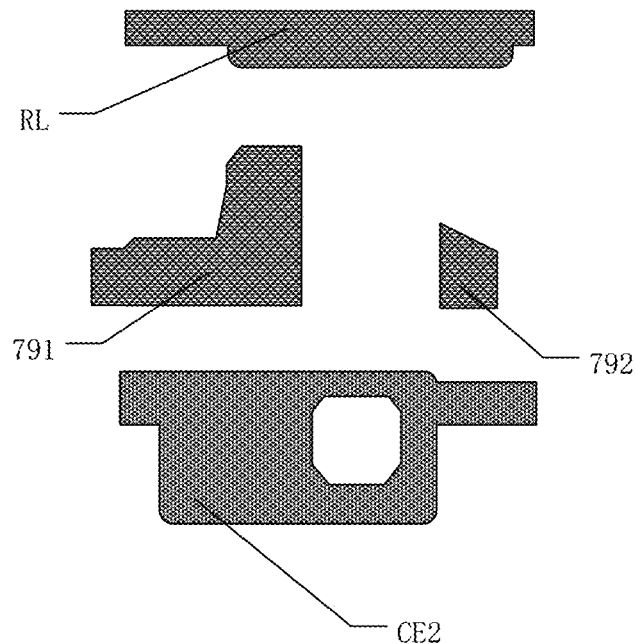

FIG. 8D shows the second conductive layer of the pixel driving circuit 7120. For example, as shown in FIG. 8D, the second conductive layer of the pixel driving circuit 7120 includes the second capacitor electrode CE2 of the storage capacitor Cst and the initialization line RL. The second capacitor electrode CE2 at least partially overlaps with the first capacitor electrode CE1 to form the storage capacitor Cst.

For example, the second electrode pattern 140 and the second capacitor electrode 172 in the above-mentioned embodiment are located in the above-mentioned second conductive layer.

In some embodiments, the second conductive layer further includes a first light shielding portion 791 and a second light shielding portion 792. An orthographic projection of the first light shielding part 791 on the base substrate 710 covers the active layer of the second thin film transistor T2, the active layer between the drain electrode of the third thin film transistor T3 and the drain electrode of the fourth thin film transistor T4, thereby preventing external light from affecting the active layers of the second thin film transistor T2, the third thin film transistor T3 and the fourth thin film transistor T4. An orthographic projection of the second light shielding part 792 on the base substrate 710 covers the active layer between the two gate electrodes of the third thin film transistor T3, thereby preventing external light from affecting the active layer of the third thin film transistor T3. The first light shielding portion 791 and the second light shielding portion 792 of the pixel driving circuit adjacent to the first light shielding portion 791 are integral structure, and the first light shielding portion 791 is electrically connected with the first power line VDD through a via hole penetrating through a second interlayer insulation layer.

In the display substrate provided by some embodiments of the present disclosure, the second interlayer insulation layer (for example, the third insulation layer 1103 in the above embodiments, not shown in FIGS. 8A-8E) is formed on the second conductive layer to protect the second conductive layer.

Figure 8E:
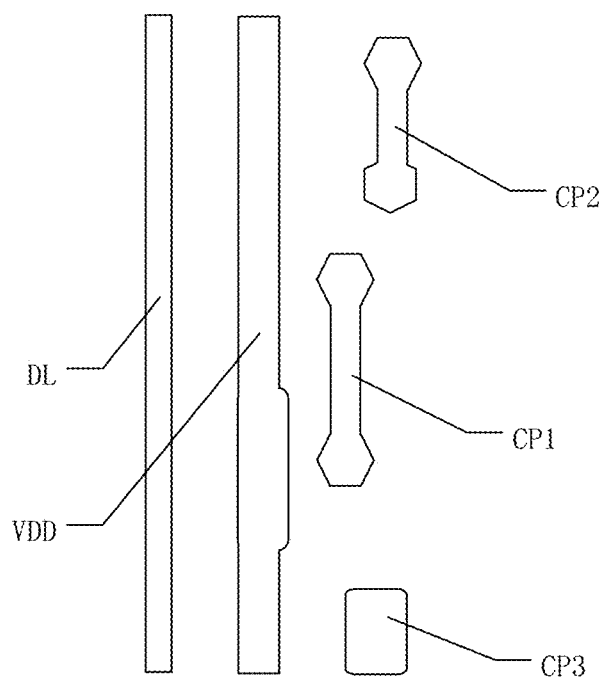

FIG. 8E shows the third conductive layer of the pixel driving circuit 7120. For example, as shown in FIG. 8E, the third conductive layer of the pixel driving circuit 7120 includes the data line DL (such as the signal line 120 in the above embodiment) and the first power line VDD (such as the first power line 183 in the above embodiment). Referring to FIGS. 8A and 8E, the data line DL is connected to the source region of the second thin film transistor T2 in the semiconductor layer through at least one via hole penetrating through the gate insulation layer, the first interlayer insulation layer and the second interlayer insulation layer. The first power line VDD is connected to the source region in the semiconductor layer corresponding to the fifth thin film transistor T5 through at least one via hole in the gate insulation layer, the first interlayer insulation layer and the second interlayer insulation layer. The first power line VDD is connected to the second capacitor electrode CE2 in the second conductive layer through at least one via hole in the second interlayer insulation layer.

For example, the power wire pattern 182, the signal line 120, the first power line 183, the source electrode 163 and the drain electrode 164 in the above-mentioned embodiment are located in the above-mentioned third conductive layer.

For example, the third conductive layer further includes a first connection part CP1, a second connection part CP2 and a third connection part CP3. One end of the first connecting part CP1 is connected to the drain region of the third thin film transistor T3 in the semiconductor layer through at least one via hole penetrating through the gate insulation layer, the first interlayer insulation layer and the second interlayer insulation layer; and the other end of the first connecting part CP1 is connected to the gate electrode of the first thin film transistor T1 in the first conductive layer through at least one via hole penetrating through the first interlayer insulation layer and the second interlayer insulation layer. One end of the second connecting part CP2 is connected to the initialization line RL through a via hole in the second interlayer insulation layer, and the other end of the second connecting part CP2 is connected to the source region of the seventh thin film transistor T7 and the source region of the fourth thin film transistor T4 in the semiconductor layer through at least one via hole penetrating through the gate insulation layer, the first interlayer insulation layer and the second interlayer insulation layer. The third connecting part CP3 is connected to the drain region of the sixth thin film transistor T6 in the semiconductor layer through at least one via hole penetrating through the gate insulation layer, the first interlayer insulation layer and the second interlayer insulation layer.

In the display substrate provided by some embodiments of the present disclosure, a protection layer (not shown in FIGS. 8A-8E) is formed on the third conductive layer to protect the third conductive layer. The first display electrode (e.g., anode) of the light emitting element in the pixel is disposed on the protection layer.

At least one embodiment of the present disclosure further provides a display device including the display substrate according to any one of the embodiments of the present disclosure.

Figure 9:
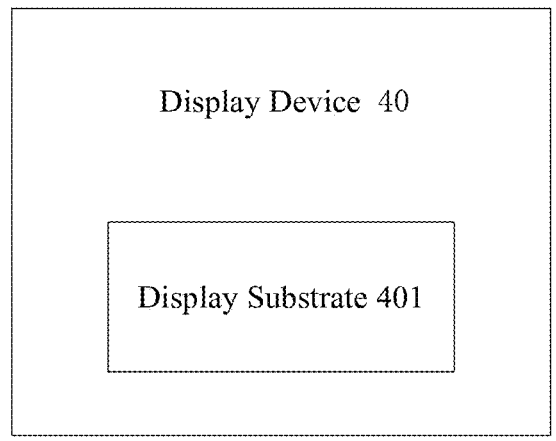
FIG. 9 is a schematic block diagram of a display device provided by some embodiments of the present disclosure.

FIG. 9 is a schematic block diagram of a display device provided by some embodiments of the present disclosure. For example, as shown in FIG. 9, the display device 40 includes a display substrate 401, and the display substrate 401 is the display substrate provided by any one of the embodiments provided by the present disclosure, such as the above-mentioned display substrate 10 or display substrate 20.

Figure 10:
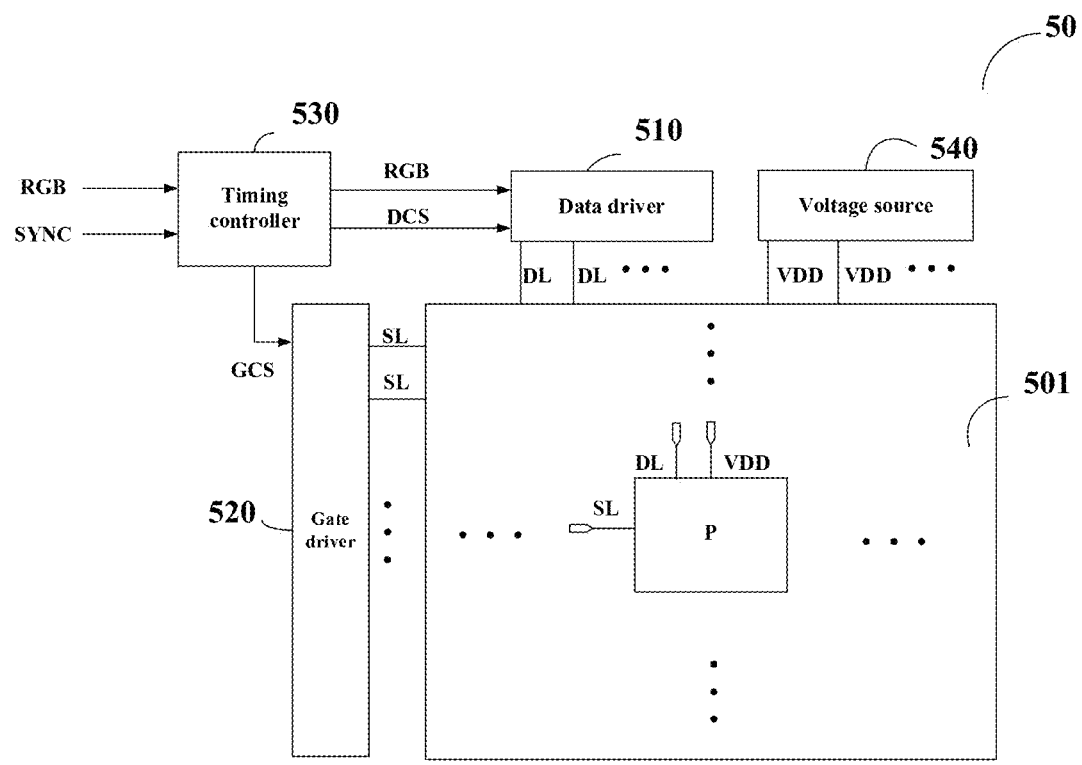
FIG. 10 is a schematic block diagram of another display device provided by some embodiments of the present disclosure.

FIG. 10 is a schematic block diagram of another display device provided by some embodiments of the present disclosure. For example, as shown in FIG. 10, the display device 50 includes a display substrate 501, and the display substrate 501 is the display substrate provided by any one of the embodiments provided by the present disclosure, such as the above-mentioned display substrate 10 or display substrate 20.

For example, as shown in FIG. 10, the display device 50 further includes a data driver 510, a gate driver 520, a timing controller 530, a voltage source 540, and the like. For example, the gate driver 520 includes the gate scan driving circuit 150 in the above-mentioned embodiments related to the display substrate 10, that is, the gate driver 520 is directly fabricated on the base substrate by a semiconductor process; the voltage source 540 includes the first voltage source electrode 181 in the embodiments described above related to the display substrate 10, and is implemented as a power management circuit, for example.

For example, in one example, the plurality of pixel units P (e.g., the pixel units 110 in the above-mentioned embodiment related to the display substrate 10) are arranged in an array in the display region of the display substrate 501, and each pixel unit P receives the data signal provided by the data driver 510 through the data line DL, and receives the voltage signal provided by the voltage source 540 through the power line VDD. For example, in the case where the signal line in at least one embodiment of the present disclosure is the data line, the data line DL includes, for example, the signal line 120 in the embodiment described above related to the display substrate 10. For example, the power line VDD includes, for example, the first power line 183 in the embodiment described above related to the display substrate 10.

For example, the data driver 510 converts the digital image data RGB input from the timing controller 530 into a data signal according to the data control signal DCS provided by the timing controller 530. For example, the data driver 510 converts the data signal into an analog voltage signal according to the data control signal DCS provided by the timing controller 530, performs a processing, such as an operational amplification, on the analog voltage signal, and then provides the corresponding data signal to each pixel unit P through the data line DL. For example, the data driver 510 is implemented as a semiconductor chip.

For example, the gate driver 520 is electrically connected to each pixel unit P through the scanning line SL to provide the scanning signal to each pixel unit P. For example, the gate driver 520 provides a selection signal according to a plurality of scan control signals GCS provided by the timing controller 530. For example, the gate driver 520 is implemented as a semiconductor chip or is integrated in the display device 50 to constitute a GOA circuit, such as the gate scan driving circuit 150 in the embodiment described above with respect to the display substrate 10.

For example, the timing controller 530 is configured to process image data RGB input from external of the display device 50, provide the processed image data RGB to the data driver 510, and provide data control signals DCS and scanning control signals GCS to the data driver 510 and the gate driver 520 to control the data driver 510 and the gate driver 520.

For example, the timing controller 530 processes the image data RGB input from the external of the display device 50 to match with the size and resolution of the display device 50, and then provides the processed image data RGB to the data driver 510. The timing controller 530 generates the scanning control signals GCS and the data control signals DCS by using a synchronization signal SYNC (for example, a dot clock DCLK, a data enable signal DE, a horizontal synchronization signal Hsync, and a vertical synchronization signal Vsync) input from the external of the display device 50. The timing controller 530 respectively provides the generated data control signals DCS and scanning control signals GCS to the data driver 510 and the gate driver 520, for controlling the data driver 510 and the gate driver 520.

The structures, functions, and technical effects of the display device 40 and the display device 50 provided by the disclosed embodiment are referred to the corresponding descriptions in the display substrate 10 or the display substrate 20 in the embodiments described above provided by the present disclosure, and are not repeated here.

For example, the display device 40 and the display device 50 provided by the embodiments of the present disclosure are organic light emitting diode display devices. Alternatively, the display device 40 and the display device 50 provided by the embodiments of the present disclosure are devices with display functions, such as quantum dot light emitting diode display devices, electronic paper display devices, or other types of display devices, and the embodiments of the present disclosure impose no limitation to the type of the display device provided by the embodiments of the present disclosure.

For example, the display device 40 and the display device 50 provided by the embodiments of the present disclosure are any product or component with display function, such as a display substrate, a display panel, electronic paper, a mobile phone, a tablet computer, a television, a display, a notebook computer, a digital photo frame, a navigator, and the embodiments of the present disclosure impose no limitation to the type of the display device provided by the embodiments of the present disclosure.

The following statements should be noted:
  (1) The accompanying drawings involve only the structure(s) in connection with the embodiment(s) of the present disclosure, and other structure(s) can be referred to common design(s).
  (2) For the purpose of clarity only, in accompanying drawings for illustrating the embodiment(s) of the present disclosure, the thickness and size of a layer or a structure may be enlarged or narrowed, that is, the drawings are not drawn in a real scale. However, it should understood that, in the case in which a component such as a layer, film, region, substrate or the like is referred to be "on" or "under" another component, the component may be directly on or under the another component or there may be an intermediate component.
  (3) In case of no conflict, the embodiments of the present disclosure and the features in the embodiments can be combined with each other to obtain new embodiments.

What is described above are only specific implementations of the present disclosure, the protection scope of the present disclosure is not limited thereto, and modifications or substitutes that constructed by a skilled person in the art within the scope of the present disclosure shall be covered by the protection scope of the present disclosure. Thus, the protection scope of the present disclosure should be based on the protection scope of the claims.

What is claimed is:

1. A display substrate, having a display region and a peripheral region at least partially surrounding the display region, and comprising: a base substrate,
   wherein the display region comprises a plurality of pixel units arranged in an array on the base substrate and a plurality of signal lines electrically connected with the plurality of pixel units respectively,
   the peripheral region comprises at least one first electrode pattern electrically connected with at least one of the plurality of signal lines, and comprises a second electrode pattern,
   the at least one first electrode pattern and the second electrode pattern are at least partially overlapped in a direction perpendicular to a substrate surface of the base substrate and are spaced apart from and insulated from each other,
   the peripheral region further comprises a gate scan driving circuit configured to provide a gate scanning signal to the plurality of pixel units,
   the at least one first electrode pattern and the second electrode pattern are between the gate scan driving circuit and the display region,
   wherein the second electrode pattern is on a side of the at least one first electrode pattern away from the base substrate,
   wherein at least one of the plurality of pixel units comprises a pixel driving circuit on the base substrate, and the pixel driving circuit comprises a thin film transistor and a storage capacitor;
   the thin film transistor comprises an active layer, a gate electrode, a source electrode and a drain electrode, and the storage capacitor comprises a first capacitor electrode and a second capacitor electrode opposite to the first capacitor electrode in the direction perpendicular to the substrate surface of the base substrate;
   the source electrode and the drain electrode are on a side of the active layer away from the base substrate,
   the first electrode pattern, the gate electrode and the first capacitor electrode are in a same layer, and the second electrode pattern and the second capacitor electrode are in a same layer.

2. The display substrate according to claim 1, wherein an orthographic projection of the at least one first electrode pattern on the base substrate is within an orthographic projection of the second electrode pattern on the base substrate.

3. The display substrate according to claim 1, wherein the plurality of signal lines are in a same layer as the source electrode and the drain electrode of the thin film transistor, and the at least one first electrode pattern is electrically connected with the at least one of the plurality of signal lines through a via hole structure.

4. The display substrate according to claim 1, wherein the second electrode pattern is configured to receive a first voltage signal from a first voltage source.

5. The display substrate according to claim 4, wherein the peripheral region further comprises a power wire pattern,
the power wire pattern is electrically connected with the first voltage source, and the second electrode pattern is electrically connected with the power wire pattern to receive the first voltage signal through the power wire pattern.

6. The display substrate according to claim 5, wherein the power wire pattern is in a same layer as the source electrode and the drain electrode of the thin film transistor,
the second electrode pattern is electrically connected with the power wire pattern through a via hole structure.

7. The display substrate according to claim 5, wherein at least part of the second electrode pattern is electrically connected between the power wire pattern and the plurality of pixel units in the direction parallel to the substrate surface of the base substrate,
the power wire pattern provides the first voltage signal to at least part of the plurality of pixel units through the second electrode pattern.

8. The display substrate according to claim 4, wherein the at least one first electrode pattern comprises a plurality of first electrode patterns which are arranged at intervals;
the peripheral region further comprises a spacer pattern which is between two adjacent first electrode patterns of the plurality of first electrode patterns and is insulated from the first electrode patterns.

9. The display substrate of claim 8, wherein the spacer pattern is configured to receive a second voltage signal from a second voltage source different from the first voltage source.

10. The display substrate of claim 8, wherein the spacer pattern is electrically connected with the second electrode pattern to receive the first voltage signal from the first voltage source.

11. The display substrate according to claim 8, wherein the spacer pattern is in a same layer as the active layer of the thin film transistor.

12. The display substrate according to claim 8, wherein the second electrode pattern is continuously arranged along an edge of the display region, the second electrode pattern is at least partially overlapped with the plurality of first electrode patterns respectively in the direction perpendicular to the substrate surface of the base substrate, and the second electrode pattern is spaced apart from and insulated from the plurality of first electrode patterns.

13. The display substrate according to claim 1, wherein an extension direction of at least part of an edge of the display region intersects and is not perpendicular to an extension direction of the plurality of signal lines.

14. The display substrate according to claim 1, wherein the display substrate further comprises a first insulation layer between the at least one first electrode pattern and the second electrode pattern,
a material of the first insulation layer comprises silicon nitride or silicon oxynitride.

15. The display substrate according to claim 1, wherein the plurality of pixel units comprise a first column of pixel units and a second column of pixel units, a total number of the pixel units in the first column of pixel units is less than that in the second column of pixel units, and the signal line electrically connected with the first column of pixel units is electrically connected with one of the at least one first electrode pattern.

16. The display substrate according to claim 15, wherein the signal line electrically connected to the second column of pixel units is electrically connected to another one of the at least one first electrode pattern,
an amount of a compensation capacitance formed between the second electrode pattern and the one of the at least one first electrode pattern is larger than an amount of a compensation capacitance formed between the second electrode pattern and the another one first electrode pattern, wherein the one of the at least one first electrode pattern is electrically connected to the signal line electrically connected to the first column of pixel units.

17. The display substrate according to claim 1, wherein:
a first end or a second end of at least one of the plurality of signal lines is electrically connected with one of the at least one first electrode pattern, or
a first end of at least one of the plurality of signal lines is electrically connected with one of the at least one first electrode pattern, and a second end of the at least one of the plurality of signal lines is electrically connected with another one of the at least one first electrode pattern.

18. A display device, comprising a display substrate, wherein the display substrate has a display region and a peripheral region at least partially surrounding the display region, and comprises: a base substrate,
wherein the display region comprises a plurality of pixel units arranged in an array on the base substrate and a plurality of signal lines electrically connected with the plurality of pixel units respectively,
the peripheral region comprises at least one first electrode pattern electrically connected with at least one of the plurality of signal lines, and comprises a second electrode pattern,
the at least one first electrode pattern and the second electrode pattern are at least partially overlapped in a direction perpendicular to a substrate surface of the base substrate and are spaced apart from and insulated from each other,
the peripheral region further comprises a gate scan driving circuit configured to provide a gate scanning signal to the plurality of pixel units,
the at least one first electrode pattern and the second electrode pattern are between the gate scan driving circuit and the display region,
wherein the second electrode pattern is on a side of the at least one first electrode pattern away from the base substrate,
wherein at least one of the plurality of pixel units comprises a pixel driving circuit on the base substrate, and the pixel driving circuit comprises a thin film transistor and a storage capacitor;
the thin film transistor comprises an active layer, a gate electrode, a source electrode and a drain electrode, and the storage capacitor comprises a first capacitor electrode and a second capacitor electrode opposite to the first capacitor electrode in the direction perpendicular to the substrate surface of the base substrate;
the source electrode and the drain electrode are on a side of the active layer away from the base substrate, the first electrode pattern, the gate electrode and the first capacitor electrode are in a same layer, and the second electrode pattern and the second capacitor electrode are in a same layer.

* * * * *